United States Patent
Gao et al.

(10) Patent No.: US 9,099,972 B2
(45) Date of Patent: Aug. 4, 2015

(54) METHOD AND APPARATUS FOR MULTI-STAGE ADAPTIVE VOLUME CONTROL

(75) Inventors: Yi Gao, Sichuan (CN); James D. Barrus, Schaumburg, IL (US); William M. Kushner, Arlington Heights, IL (US); Yu Liu, Chendu (CN); Li Xiao, Chengdu (CN)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 13/509,619

(22) PCT Filed: Mar. 13, 2012

(86) PCT No.: PCT/CN2012/072278
§ 371 (c)(1),
(2), (4) Date: May 14, 2012

(87) PCT Pub. No.: WO2013/134929
PCT Pub. Date: Sep. 19, 2013

(65) Prior Publication Data
US 2015/0016633 A1      Jan. 15, 2015

(51) Int. Cl.
*H03G 3/00*       (2006.01)
*H03G 3/20*       (2006.01)
*H04M 1/60*       (2006.01)

(52) U.S. Cl.
CPC ............... *H03G 3/20* (2013.01); *H04M 1/6041* (2013.01)

(58) Field of Classification Search
None
See application file for complete search history.

(56) References Cited

U.S. PATENT DOCUMENTS

| | | | |
|---|---|---|---|
| 88,224 A | 3/1869 | Smith | |
| 270,467 A | 1/1883 | Parker | |
| 5,666,426 A * | 9/1997 | Helms | 381/57 |
| 5,966,438 A * | 10/1999 | Romesburg | 379/388.03 |
| 6,298,247 B1 | 10/2001 | Alperovich et al. | |
| 6,784,816 B2 | 8/2004 | Melanson et al. | |
| 6,868,162 B1 | 3/2005 | Jubien et al. | |
| 7,742,746 B2 | 6/2010 | Xiang et al. | |
| 2004/0193422 A1 | 9/2004 | Fado et al. | |
| 2005/0282590 A1 | 12/2005 | Haparnas | |
| 2006/0270467 A1 | 11/2006 | Song et al. | |
| 2009/0088224 A1 | 4/2009 | Le Gall et al. | |
| 2010/0215194 A1* | 8/2010 | Bhattacharya | 381/106 |
| 2012/0123769 A1 | 5/2012 | Urata | |

FOREIGN PATENT DOCUMENTS

| | | |
|---|---|---|
| CN | 101378423 A | 3/2009 |
| CN | 101669284 A | 3/2010 |
| EP | 2244254 A1 | 10/2010 |
| KR | 20100002300 B1 | 1/2010 |
| WO | 2008146189 A2 | 12/2008 |
| WO | 2010131470 A1 | 11/2010 |

OTHER PUBLICATIONS

International Search Report for International Patent Application No. PCT/CN2012/072278 mailed Dec. 20, 2012.

* cited by examiner

*Primary Examiner* — Brenda Bernardi
(74) *Attorney, Agent, or Firm* — Barbara R. Doutre

(57) ABSTRACT

A method and apparatus for adaptively controlling the audio output (122) of a communication device (114) according to the noise characteristics of the receiver listening environment (119). An output volume for the communication device (114) is set by a user (e.g., listener 118). The communication device (114) can intermittently sample ambient noise (116) of its environment (119). A minimum signal to noise threshold can be established for audio output (122). A total adjustment for the audio output (122) is established based on the ambient noise (116), the user set output volume, and the minimum signal to noise threshold. The total adjustment is a product of a software volume adjustment (230) and a hardware gain adjustment (240). The software volume adjustment (230) and the hardware gain adjustment (240) is adaptively applied when the communication device (114) outputs audio (122).

8 Claims, 6 Drawing Sheets

METHOD AND APPARATUS FOR MULTI-STAGE ADAPTIVE VOLUME CONTROL

FIELD OF THE DISCLOSURE

The present disclosure relates generally to adaptive volume control for communication devices and more particularly to multi-stage adaptive volume control for half-duplex speech communication devices.

BACKGROUND

Communications devices, such as two way radios and cellular phones, are frequently used in noisy environments which can make listening to received speech audio problematic. In a full duplex communications system such as a cellphone system, bidirectional communication is continuous. Noise samples are easily obtainable at both ends of the communications channel since both sides are simultaneously active, usually for long periods of time (e.g. minutes). Thus, noise adaptive signal processing methods designed to improve speech quality in noise in full duplex systems usually have more than sufficient time to sample background noise and adapt output speech for the listener to ambient noise conditions. In addition, since cellphones are normally held at the ear, a limited amount of audio gain increase (i.e. loudness) is usually sufficient to overcome the effects of high ambient noise. This gain increase modification usually can be performed in software by simply scaling the signal amplitude within the limits of its numerical representation prior to the device output audio amplifier.

Half-duplex speech communication devices, such as two-way radios, are widely used by enterprises and governments. In a half-duplex system, either the transmit (e.g., a transmit state) or receive side (e.g., a receive state) is active at one time. When not active (i.e. not receiving or transmitting a signal) the radio is usually placed in a reduced power idle state (i.e. sleep mode to conserve power) until an incoming signal is received or the transmit state is activated. When a downlink signal/message is received the radio needs to "wake up" to process the incoming signal. This wakeup period is often short (tens or hundreds of milliseconds). In addition, half-duplex transmitted messages, such as those common in public safety use environments, tend to be much shorter than messages conveyed in a full-duplex public cellphone communications environment so the time available to estimate the noise and complete noise adaptation to enhance the message audio also tends to be very short. These time limiting half-duplex radio operating conditions make noise estimation and noise-adaptive signal conditioning more problematic than for full-duplex systems. Also, two-way half-duplex radios are frequently used by public safety and commercial users in variable, rapidly changing, extreme noise environments (e.g. airports, factories, fire scenes, stadiums, etc.) and are typically held away from the ear (e.g. forearm, shoulder, belt, console position). This requires a higher audio volume output to overcome the ambient noise.

Accordingly, there is a need for an improved method and apparatus for adapting volume control for half-duplex communication devices.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
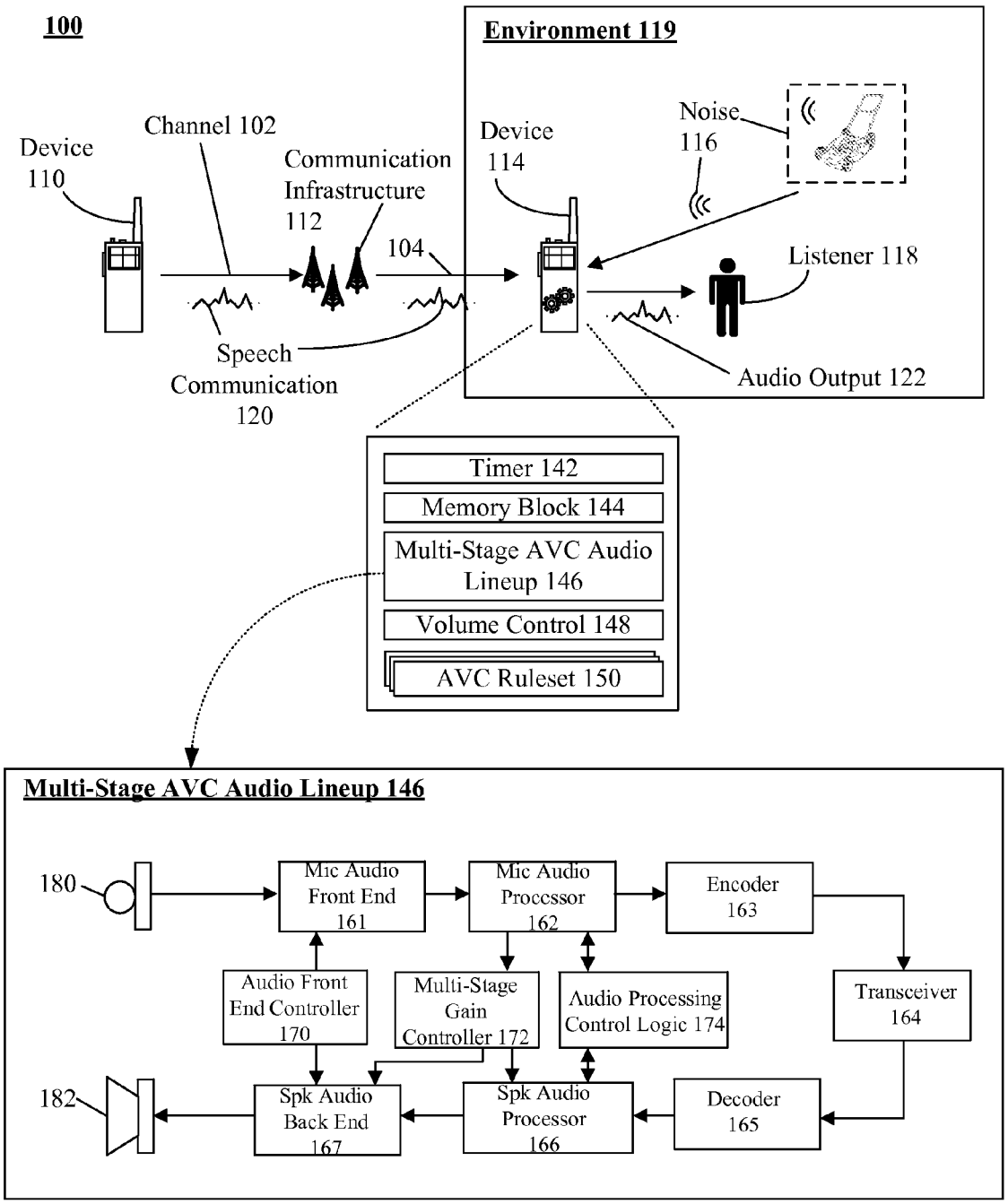
FIG. 1 is a diagram for multi-stage adaptive volume control for a communication device in accordance with an embodiment of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

A method, apparatus, system, or computer program product for adaptively controlling audio output of a communication device is disclosed herein. In embodiments of the disclosure, a wirelessly conveyed speech communication is received at a communication device from another communication device. The conveyed speech communication is part of a real-time communication session. In response to receiving the speech communication, a total adjustment is determined for the speech communication. The total adjustment can, in one embodiment, be based on ensuring output from the communication device has a signal to noise ratio (SNR) greater than an established threshold. This determination can be calculated by sampling background noise using a user-established reference volume as a baseline output volume, and adjusting this baseline volume as necessary given the background noise. Adjustments can be automatically performed as part of an adaptive volume control (AVC) function of the communication device.

In one embodiment, in response to determining the total adjustment, a first stage software volume adjustment and a second stage hardware gain adjustment can be determined. A combination of the first stage software volume adjustment and the second stage hardware gain adjustment result in the total adjustment. The software volume adjustment is a signal scaling adjustment of signal amplitude prior to the signal being conveyed to an output audio amplifier of the communication device. The hardware gain adjustment is an adjustment to the output audio amplifier gain. The software gain adjustment and the hardware gain adjustment are applied to the speech communication. Audio of the speech communication is output from an audio transducer of the communication device.

FIG. 1 is a diagram 100 for multi-stage adaptive volume control for a communication device 114 in accordance with an embodiment of the disclosure. The communication device 114 can be a two-way radio or other half-duplex device; although other embodiments for different communication devices are contemplated. In diagram 100, a real-time communication session is established between two different communication devices 110, 114. Communication device 114 implements an adaptive volume control (AVC) function, which enables a user of the device 114, referred to as a listener 118, to clearly hear speech communications 120 within a listening environment 119. For example, audio output 122 can be adaptively adjusted for background noise 116 (also referred to as ambient noise or noise) given listener volume preferences (as set by volume control 148) to ensure at least a minimum signal to noise ratio (SNR) is maintained. In one embodiment, a total adjustment of volume performed by device 114 is a two stage adjustment, where the first stage is a software volume adjustment and the second step is a hardware gain adjustment. One or more disclosed adaptations expressed herein can be particularly beneficial for half-duplex communication devices. These adaptations can, for example, ensure that the AVC function of communication device 114 behaves gracefully for speech communications with short message times characteristic of half-duplex communication sessions.

A communication infrastructure 112 may exist between the devices 110, 114 or the devices 110, 114 may communicate directly with each other. When a communication infrastructure 112 is used, one communication device 110 can communicate over one channel 102 with the communication infrastructure 112 and the other communication device 114 can communicate with the communication infrastructure 112 over a different communication channel 104. The communication channels 102, 104 can conform to different or to the same communication protocols. At least the communication channel 104 used by communication device 114 can be a wireless communication channel, in one embodiment. One or more speech communications 120 can be conveyed between the communication devices 110, 114 as information encoded within signals, which travel between the devices 110, 114 over a transmission medium.

One contemplated AVC function uses a multi-stage adaptive volume control, which permits a total adjustment having a wider range than is possible from devices that depend on a single state volume control. That is, a multi-stage AVC function of device 114 can improve intelligibility (e.g., clarity, loudness) characteristics of the audio output 122. In one embodiment, the AVC is applied based on an AVC ruleset 150 in response to noise 116. That is, communication device 114 can utilize noise estimation to appropriately enhance audio output 122 audibility beyond the limitations of traditional adaptive volume control mechanisms. In one instance, AVC is performed via multi-stage adaptive volume control audio lineup 146 of half-duplex speech communication device 140.

Communication device 114 components can include, but are not limited to, a timer 142, a memory block 144, a multi-stage adaptive volume control audio lineup 146, a volume control 148, a transceiver, an AVC ruleset 150, and the like.

Timer 142 controls a timing of samples of ambient noise 116 during a noise estimation process. Memory block 144 can be utilized to temporarily store data representing the speech communication 120, a noise sample, a noise estimation value, a volume setting, the AVC ruleset 150, and the like. The audio lineup 146 performs a multi-stage AVC responsive to receiving transmitted speech 120. Volume control 148 is a user specified option for controlling a volume of the output audio (122). In one instance, volume control 148 can be a physically adjustable volume dial on the communication device 114. In other instances, volume control 148 can be implemented by a set of one-or-more buttons, by a slider, by a touch-screen graphical user interface (GUI) control, and the like.

In audio transmitting lineup 146, a microphone audio front end circuit 161 can be used to sample the analog audio data from a microphone 180. The audio lineup 146 is optionally able to pre-process the audio data (e.g. filtering) and to convert from an analog to a digital signal. Microphone audio processor 162 can include, but is not limited to, several audio processing blocks (e.g., adaptive microphone gain controller), noise estimator, noise attenuator, voice activity detector, echo canceller, and the like. The processed microphone audio signal can be inputted into a voice encoder (e.g., encoder 163) and transmitted out by transceiver 164 logic.

In the receiving lineup, the received encoded signal by transceiver is decoded by a voice decoder 165 to obtain audio samples. The speaker audio processor 166 further processes the received audio data. For example, the speaker audio processor 166 reshapes the audio data spectrum and adjusts the signal gain according to an ambient noise estimate generated in the microphone audio processor 162 using a user selectable formula provided by the multi-stage gain controller 172. The processed audio signal is sent to speaker audio back end 167 for post-processing (e.g. filtering), amplifying, and play back through speaker 182 (i.e., the device hardware output audio transducer). Audio front end controller 170 can be used to control the status of audio front end. Controller 170 can include A/D (analog-to-digital) converter control, front end hardware activation/deactivation (i.e., changes from transmit state, receive state, and idle state), device power control, and the like.

Multi-stage gain controller 172 includes rules (e.g. formulae) for controlling the overall device audio output volume by means of separate software gain and hardware gain control strategies. Audio processing control logic 174 can include a downlink VAD (voice activity detector) to determine the periods in which speech communications 120 are being received, and a double-talk detector (simultaneous uplink and downlink speech are present) mechanism which determines if an echo of the speaker 182 output is being picked up by the microphone 180 during noise sampling. The outputs of these detectors can control the noise estimation and tracking in the microphone audio processor 162, especially in the case that an echo canceller in the microphone audio processor 162 cannot completely cancel the feedback echo from the speaker 182 output and effects from spectrum shaping in speaker audio processor 166.

As used herein, communication device 110, 114 can be implemented as a two-way radio, a mobile telephony device, a smart-phone, a personal computer, a computing tablet, a base station, and/or the like. The communication device 110, 114 permits half-duplex communications, in one embodiment.

The communication infrastructure 112 refers to the backbone of a communication system upon which broadcasting and telecommunication services are operated. The communication infrastructure 112 can be built from copper cable, fiber, or wireless technologies utilizing the radio frequency spectrum, such as microwave and satellite. The infrastructure 112 is the core component that connects upstream production, such as voice, data and audiovisual services, with downstream consumers. The communication channels 102, 104 may include radio links, optical links (e.g., fiber, free-space laser, infrared), and/or wire lines. Further, each the communication channels 102, 104 can utilize wireless communication technologies, in one embodiment.

Noise 116 is an environmental sound which interferes with speech communication 120 audibility. For example, noise 116 can result from background conversations near listener 118. Noise 116 can include natural background noise and artificially generated noise. Artificially generated noise can include, for example, traffic noise, machine noise, factory noise, alarms, music, human speech, bio-acoustic noise, and the like.

Speech communication 120 is a segment of a communication session within which speech of a communicator is encoded. Speech communication 120 includes analog and/or digitally encoded human speech. Speech communication 120 may be digitally processed (e.g., compressed) and conveyed over a transmission medium. In one embodiment, speech communication 120 includes intelligibility enhancements, which are applied prior to transmission from a remote device 110. Communication devices 110, 114 can be dissimilar communication device types sharing the same communication infrastructure 112. Processing operations performed on speech communications 120 by the communication infrastructure 112 and/or communication device 110, 114 include, for example, protocol conversions, digital signal processing (DSP), text-to-speech and speech-to-text conversions, language conversions, and the like.

Figure 2:
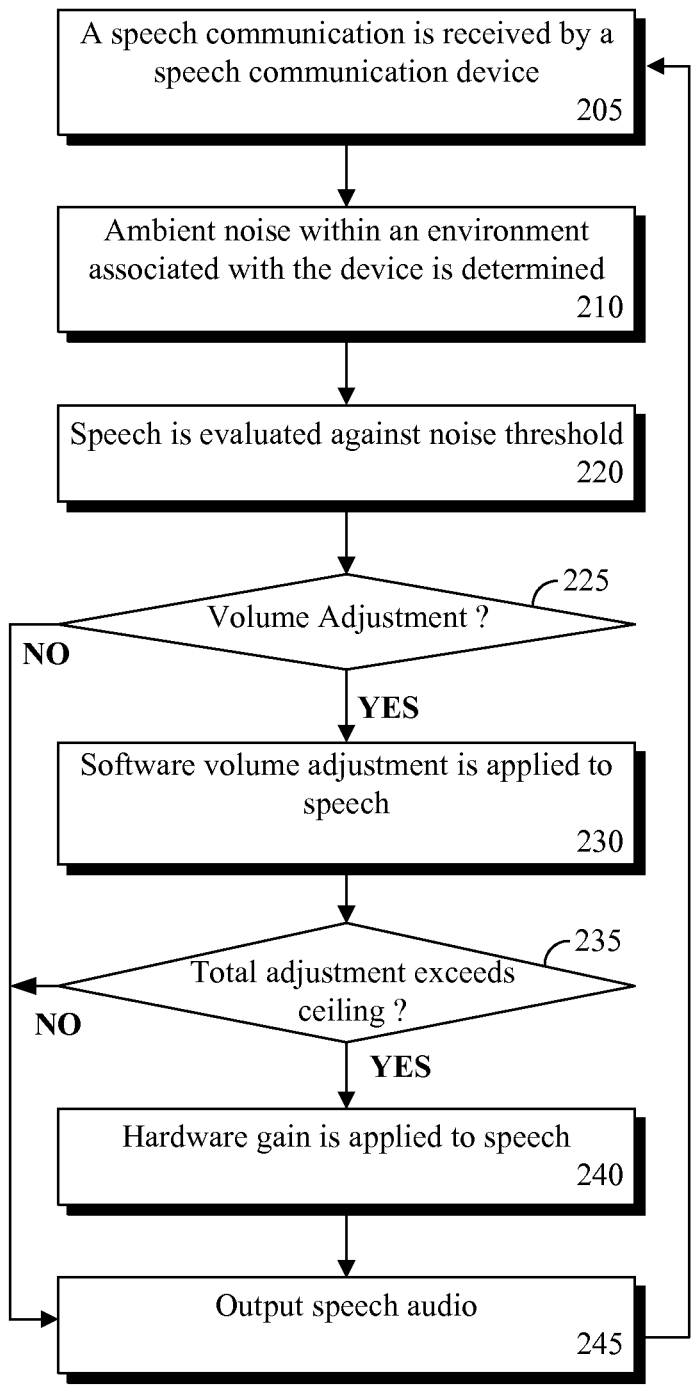
FIG. 2 is a flow chart of a method for multi-stage adaptive volume control in a communication device in accordance with embodiments of the disclosure.

FIG. 2 is a flow chart of a method 200 for multi-stage adaptive volume control in a communication device in accordance with embodiments of the disclosure. Method 200 can begin in step 205, where a speech communication is received by a speech communication device. The speech communication is transmitted during a real-time communication session, which can be a half-duplex or full-duplex communication session in embodiments of the disclosure. In step 210, samples of ambient noise within a listening environment are determined. Noise determination computations are then performed utilizing traditional and/or proprietary techniques. In one embodiment, techniques used for noise estimation can be selected that adapt quickly to changes in noise level (e.g. <1 second).

In step 220, the speech communication volume setting is evaluated against a previously established noise threshold value. The noise threshold is expressed as a value or a range of values. In step 225, if gain (an upwards or downwards volume adjustment) is required, the method 200 progresses to step 230, else the method progresses to step 245.

In step 230, additional gain in the form of software gain scaling is applied to the speech communication signal. Software gain includes traditional and/or proprietary software generated gain. Software gain scaling can be applied using a linear or non-linear formula (e.g. gain curve) to increase or decrease the amplitude of an audio speech signal. For example, a software gain can include a non-linear audio compression/expansion curve which is able to amplify an audio speech signal gain within a range of zero to nine or thirteen decibels without resulting in saturation and/or clipping. In another example, the gain curve can be made dependent on the spectral content of the noise or to the noise spectral content relative to the speech spectral content. In step 235, if software gain needed for a particular noise level exceeds a software ceiling, the method continues to step 240 for additional gain, else it proceeds to step 245.

In step 240, an additional hardware gain is applied to the speech communication signal. A hardware audio amplifier within the communication device is controlled by the hardware gain adjustment. In one instance, the hardware amplifier boosts signal gain up to a defined maximum limited by one or more criteria. Criteria can include signal distortion settings, user defined settings, and the like. In step 245, the adjusted (or non-adjusted) signals is transformed from electrical signals to sound waves by an audio transducer, such as a speaker.

In one instance, the audio output can have an output volume gain in a range of fifteen to thirty decibels greater than what the transmitted speech could produce without the AVC feature.

In contemplated embodiments, method 200 can be performed in real-time or near real-time. It should be understood that the method 200 can be performed within an uplink or downlink audio lineup.

Figure 3:
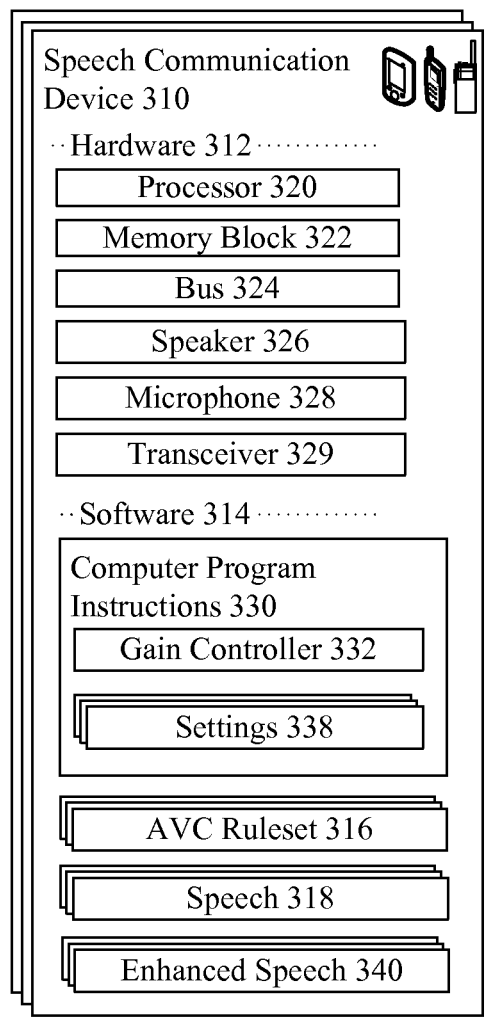
FIG. 3 is a block diagram illustrating a system for multi-stage adaptive volume control in communication device in accordance with embodiments of the disclosure.

FIG. 3 is a block diagram illustrating a system 300 for multi-stage adaptive volume control in communication device in accordance with embodiments of the disclosure. In one embodiment, speech communication device 310 can represent on contemplated implementation for communication device 140, although others are contemplated. In system 300, a speech communication device 310 can include computer program instructions 330 to perform a multi-stage adaptive volume control (AVC) upon speech communications 318 to produce enhanced speech 340.

Speech communication device 310 can include, but is not limited to, hardware 312, software 314, AVC ruleset 316 (e.g., AVC ruleset 150), speech 318, enhanced speech 340, and the like. In one instance, device 310 can be a Project 25 compliant device. Device 310 can be communicatively linked via one or more wired and/or wireless communication mediums. It should be appreciated that device 310 is an exemplary configuration and should not be construed to limit the invention in any regard. Hardware 312 can include, but is not limited to, one or more processors 320, memory block 322 (e.g., memory block 144), bus 324, speaker 326 (e.g., speaker 182), microphone 328 (e.g., microphone 180), transceiver 329, and the like. Software 314 can include computer program instructions 330, processing logic, audio processing logic, and the like. In one embodiment, software 314 can be substituted for corresponding firmware or circuit implemented logic.

Computer program instructions 330 can be one or more executable logic blocks for performing a software and/or hardware gain upon a speech 318. Instructions 330 can include, but is not limited to, gain controller 332 logic, settings 338, and the like. It should be appreciated that one or more portions of instructions 330 can be optional. It should be understood that instructions 330 can represent a component organization of multi-stage AVC audio lineup embodiment 160 and should not be construed to limit embodiment 160 and/or system 300 in this regard.

Gain controller 332 can be a programming logic permitting the execution of a software and hardware gain on speech 318. Gain controller 332 can utilize AVC ruleset 316 to perform appropriate software and/or hardware gain. In one instance, gain controller can calculate dynamic volume curve, control power management functionality associated with the disclosure, and the like.

Settings 338 can be one or more options for configuring the behavior of controller 332. Settings 338 can include, manufacturer defined settings, user established settings, and the like. In one instance, settings 338 can include AVC ruleset 316, user specified volume settings, and the like.

AVC ruleset 316 can be utilized to dynamically determining AVC gain a response curve based on a user established volume. AVC ruleset 316 can include multiple response curves which can be user selectable. In one instance, AVC ruleset 316 can be continually optimized based on user settings, device usage, environmental noise, and the like.

Drawings presented herein are for illustrative purposes only and should not be construed to limit the invention in any regard. Device 310 can be associated with a downlink device and/or an uplink device. It should be appreciated that instructions 330 can be persisted within memory block 322. Device 310 components can include additional components not presented within system 300 (e.g., timer 142, volume control 148) which can be utilized to perform multi-stage AVC.

Figure 4:
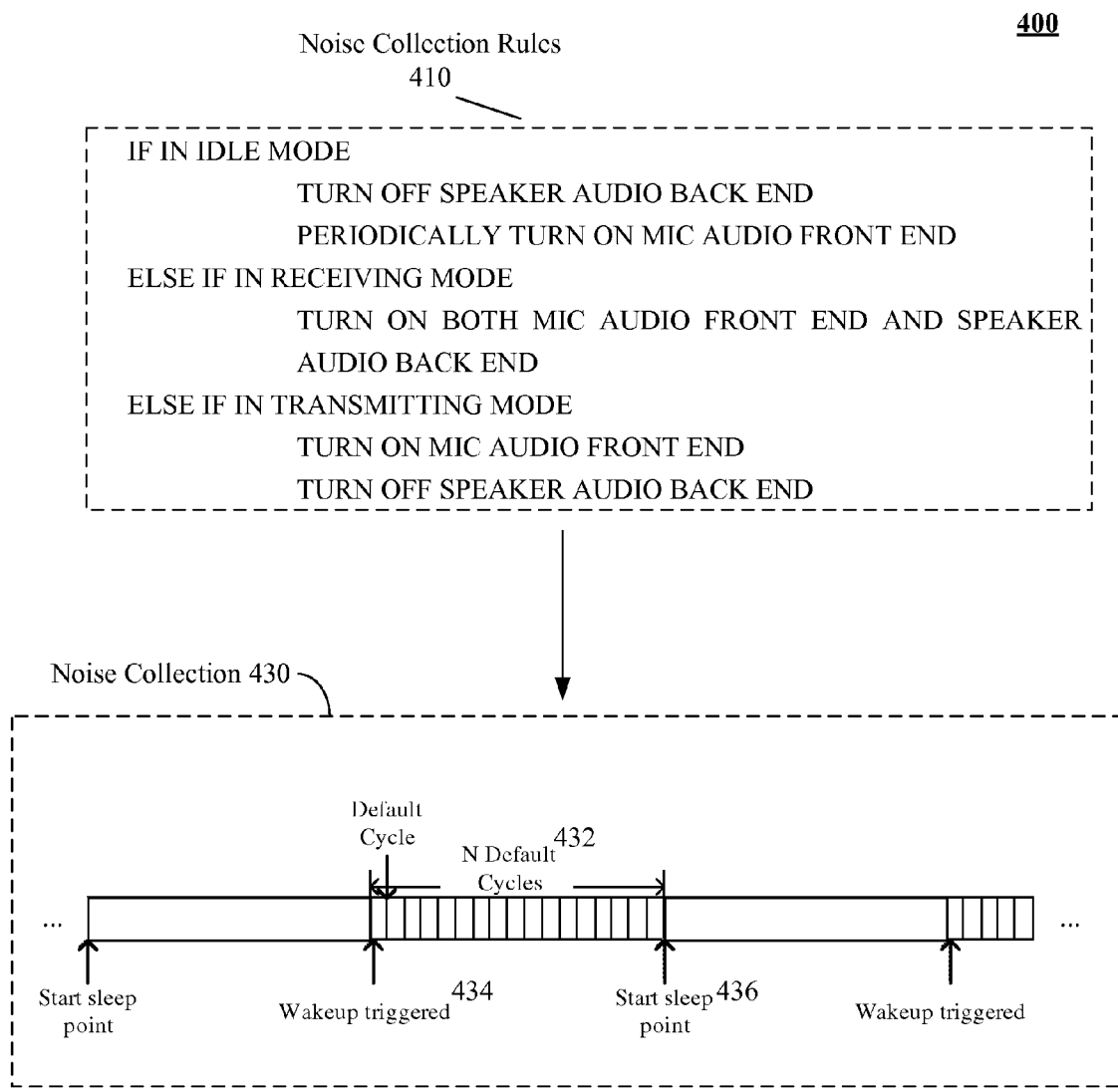
FIG. 4 is a diagram for multi-stage adaptive volume control in a speech communication device in accordance with embodiments of the disclosure.

FIG. 4 is a diagram 400 for multi-stage adaptive volume control in a speech communication device in accordance with embodiments of the disclosure. In diagram 400, a set of noise collection rules 410 can be utilized to direct a noise collection 430 process within a half-duplex speech communication device. It should be appreciated that rules 410 can be a pseudo-code representation of executable code.

In noise collection rules 410, each communication mode of a half-duplex speech communication device can include an executable command to control a speaker audio back end and a microphone audio front end. Communication modes can include an idle mode, a receiving mode, and a transmitting mode. In idle mode, the speaker audio back end is toggled into an off state and the microphone audio front end can be periodically activated to collect noise samples (e.g., noise collection 430). The microphone audio front end can be activated based on a multiple number of default cycles. For example, if a default cycle is twenty milliseconds, the microphone audio front end can be activated for an arbitrarily defined number N of default cycles 432. That is, in idle mode, microphone audio lineup samples the noise per the pre-defined sampling period of N default cycles which can be stored in a memory block. In one embodiment, the microphone audio front end conveys the latest microphone noise samples to a microphone audio processor for processing in a frame-by-frame manner (e.g., twenty milliseconds per frame).

In receiving mode, both the microphone audio front end can be enabled and speaker audio back end can be enabled. In transmitting mode, the microphone audio front end can be activated and the speaker audio back end can be toggled to an off state.

It should be appreciated that rules 410 can be enabled to alter the default device battery consumption logic. That is, devices can turn off the microphone audio front end circuit when a subscriber is operating in receiving mode and idle mode. To enable timely monitoring of the ambient noise within an environment and effectively calculate the noise estimate, audio front end control logic (e.g., rules 410) can be utilized.

In noise collection 430, a microphone audio front end can be enabled and disabled based on a default cycle of the speech communication device. The default cycle can be determined based on device configuration parameters (e.g., settings stored within a memory block). The microphone audio front end can be enabled (e.g., wakeup triggered 434) to sample noise within an environment and disabled (e.g., start sleep point 436) for n number of default cycles 432.

Figure 5:
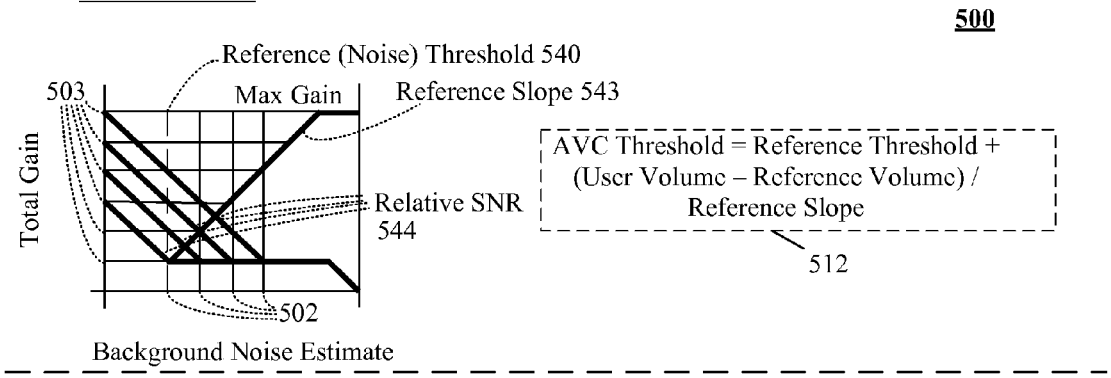
FIG. 5 is a diagram for multi-stage adaptive volume control in speech communication device in accordance with embodiments of the disclosure.
Figure 5:
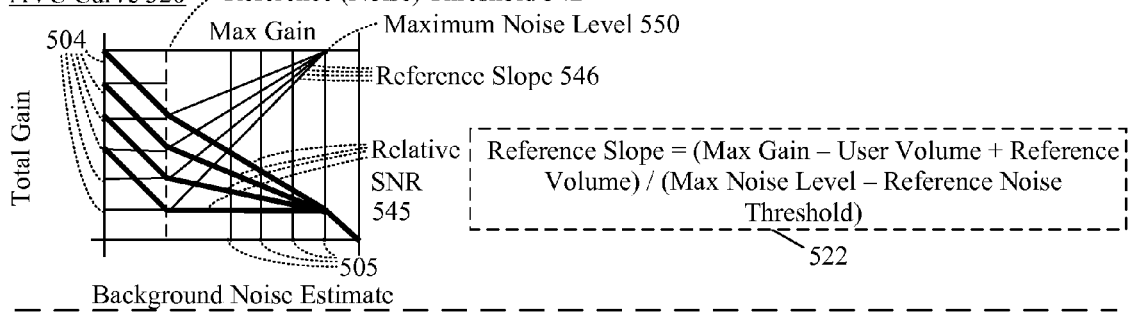
Figure 5:
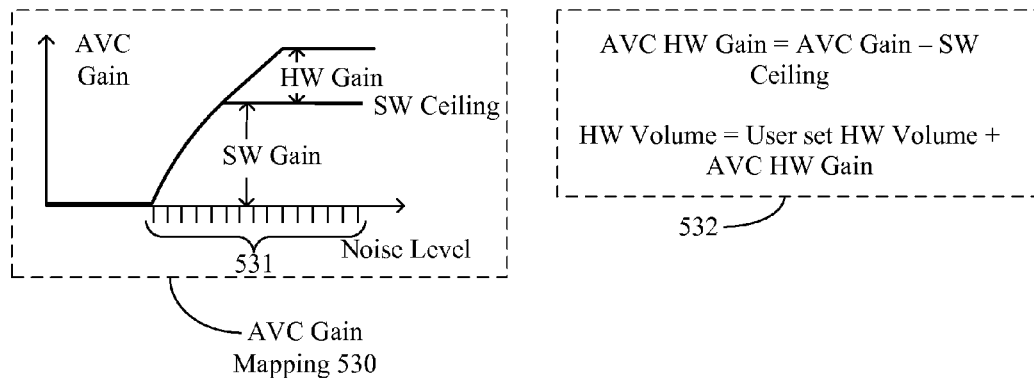

FIG. 5 is a diagram 500 for multi-stage adaptive volume control in a speech communication device in accordance with embodiments of the disclosure. In order to improve the speech intelligibility in noisy environments, adaptive volume control (AVC) methods are herein adopted in half-duplex speech communication devices. The relationship between the ambient noise level and the applied AVC signal gain can be defined in many ways according to specified formulae. In this invention the relationship is defined by a reference noise threshold 540, 542, the current volume control 503, 504 (hardware gain) setting set by the user, and the definition of the noise-gain curve reference slope 543,546 which can be linear or non-linear. In one embodiment, two user selectable formulae, which can determine the AVC curve based on the reference noise threshold 540, 542, and the default volume setting set by the user include AVC Curve 510 and AVC Curve 520.

Appreciably, for a fixed SNR threshold, an increase in background noise 502, 505 can result in corresponding increases in AVC gain. That is, as background noise increases, the speech output volume must increase to maintain a floor (lower threshold) for a specified minimum SNR. As background noise decreases, previously made adjustments to volume can be correspondingly decreased, while still ensuring that the desired minimum specified SNR is maintained.

Similarly, an amount of total AVC gain needed to ensure a given minimum SNR decreases as the initial user-established hardware volume (volume control setting 503, 504) increases. That is, a desired total volume is calculated and the total adjustment needed to achieve this desired total audio output volume is based on a current volume setting set manually by the user, and the measured ambient noise level. These relationships between user-established volume (i.e. user volume) 503,504, ambient noise levels (i.e. background noise estimate) 502,505, and total adjustments (i.e. total gain) needed to achieve a relative SNR 544, 545 are expressed by AVC Curves 510, 520.

In AVC Curve 510, when an ambient noise level exceeds an AVC threshold 502, a gain controller can start calculating the increased AVC gain determined by the reference slope 543. More specifically, the AVC threshold which is the reference noise threshold 540 at which the AVC gain can begin to increase, can be dynamically calculated based on the default volume setting (i.e. user volume) 503. For example, if the user has set the default volume at "Volume Level 2", the AVC threshold can be set at a specified noise level (e.g., 502). The AVC threshold decision can be based on the relationship 512 where: AVC Threshold=Reference(Noise)Threshold+(User Volume−Reference Volume)/Reference Slope. The reference (noise) threshold 540, reference volume and reference slope 543 can be pre-defined in a memory block. The reference volume refers to a pre-determined volume setting. The reference (noise) threshold 540 can be the noise level 502 measured in relatively quiet environment. The user volume 503 can be a typical volume chosen by the user from those among the whole range of the device to produce a comfortable listening volume. The reference slope 543 can be set to a value of 1.0 to maintain a desired minimum Signal-to-Noise Ratio (SNR) once the current noise level exceeds the reference threshold 540. The SNR can be maintained at a constant level by adjusting the signal gain commensurate with changes in the estimated noise level (i.e. background noise estimate) 502. For curve 510 the AVC gain adjusts at a constant rate independent of the initial user volume setting 503.

In Curve 520, the reference slope 546 can be dynamically calculated based on a default volume (i.e. user volume) setting 504. The reference slope 546 decision can be based on relationship 522: Reference Slope=(Max Gain−User Volume+Reference Volume)/(Max Noise Level−Reference (Noise)Threshold). Max Gain is defined as the maximum achievable gain. Note that in this embodiment a constant minimum SNR above the reference noise threshold 542 is not maintained. The AVC gain adjusts at a faster rate for low initial volume settings 504 than it does for higher initial volume settings 504. The reference threshold, max gain, and reference volume 504 can be pre-defined in the memory block. In the preferred embodiment the user can select either AVC control curve 510 or 520 depending on his or her preference. It should be noted that AVC gain curves 510 and 520 are only two examples of gain curves that can be employed in embodiments of the disclosure.

In order to enhance the received audio intelligibility, the receiving device may adjust the receiving (Rx) output volume based on the noise estimation result. The Rx volume adjustment can be applied as a software (SW) gain and hardware (HW) gain. The SW gain can be applied first, and if the total gain needed to be applied is larger than SW gain ceiling, the HW gain can be applied. The SW gain ceiling and HW gain ceiling can be pre-defined in memory block.

The AVC gain can be mapped to a HW gain and a SW gain as shown in AVC gain mapping 530. When an ambient noise level 531 exceeds a threshold for the AVC adjustment, the AVC can provide a positive gain to the speaker output samples. If the AVC gain is less than the SW Ceiling, it will be totally applied by the SW gain contoller. The SW ceiling can be the maximum gain that the SW gain controller can perform. The maximum SW gain depends on the maximum dynamic range of the numerical representation of the signal samples in the device. For example, if a 16 bit integer is used to represent digitized signal samples the applied software gain is limited to scaling the sample to a maximum value of +/−32768 without causing clipping. The SW ceiling can also be defined to prevent a saturation or "over swing" of the HW amplifier. If the AVC gain exceeds the SW ceiling, AVC HW gain can be applied as shown in relationship 532: AVC HW gain=AVC Gain−SW Ceiling. A HW volume can be calculated by the multi-stage gain controller (e.g., controller 172) using the relationship: New HW volume=user set HW volume+AVC HW Gain. The gain controller can program the audio output amplifier volume appropriately.

It should be appreciated that audio output from the device speaker can get fed back to the device input microphone (e.g., the tone signal or speech signal) and the traditional echo canceller may not be able to suppress all feedback. In this situation, incorrect noise estimation can be caused by the poor isolation between the device microphone and speaker and failure of the echo canceller. Audio processing control logic (e.g., logic 174) can be used to control the noise estimation in microphone audio processor 162 and spectrum reshaping in speaker audio processor 166.

Figure 6:
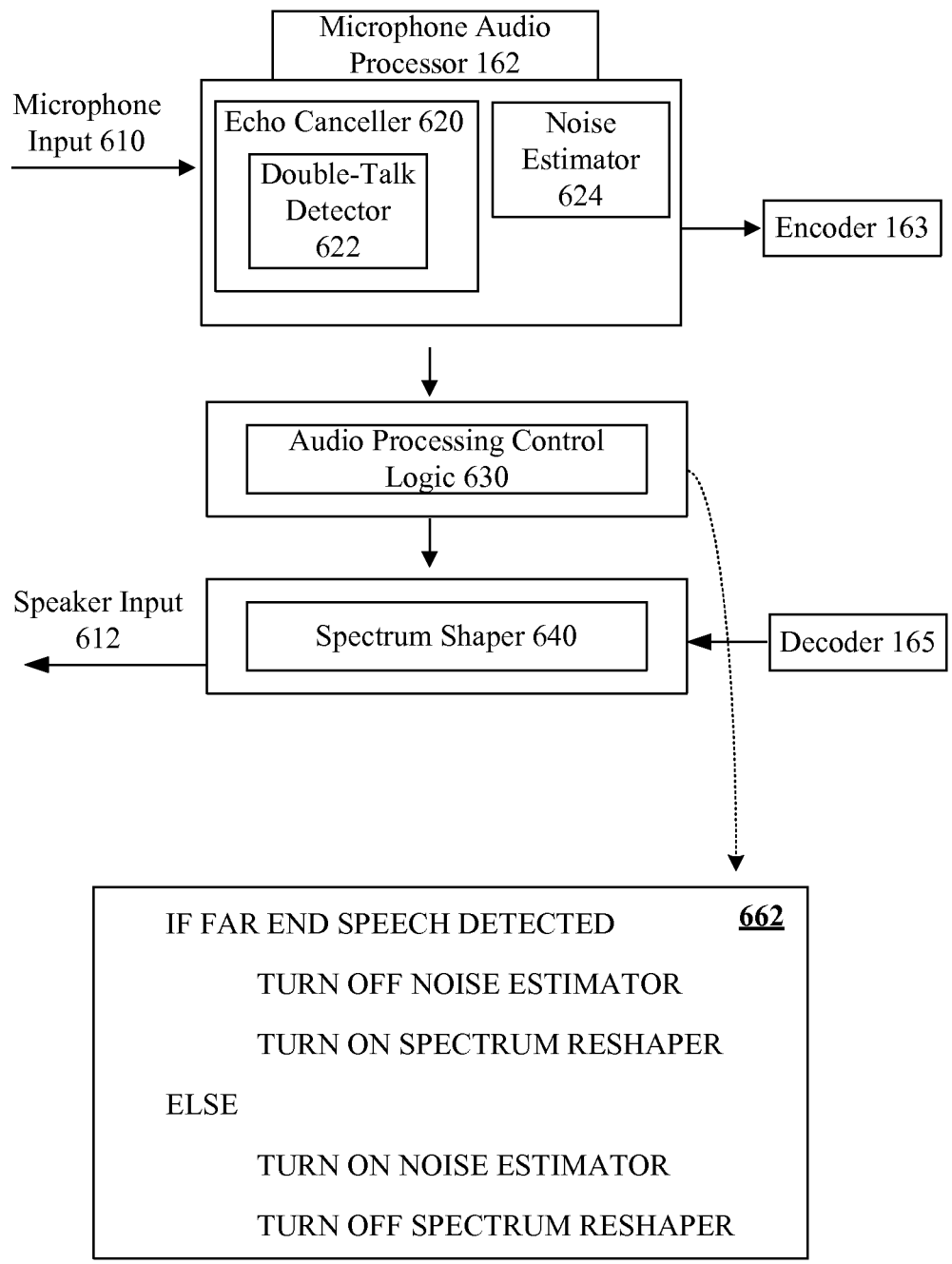
FIG. 6 is a diagram illustrating multi-stage adaptive volume control in a communication device in accordance with embodiments of the disclosure.

FIG. 6 is a diagram illustrating multi-stage adaptive volume control 600 in a communication device in accordance with embodiments of the disclosure. In FIG. 6, the audio processing control 600 logic uses information from the microphone audio processor 162, specifically from the double-talk detector 622 to control the noise estimator 624 in the microphone audio processor 162 and the spectrum shaper 640 in the speaker audio processor 166.

Double-talk detector 622 can make use of attenuators in order to reduce the audio output of the speaker 182 which, in turn, reduces the level of the echo coupled into the microphone 180 of the communication device. Thus, double-talk detector is a component for handling a specific echo cancellation situation (e.g., reducing problems with double-talk). The double-talk detector 622 can be essential to keep an adaptive filter from diverging in the presence of near-end speech and other disruptive noise. Echo canceller 620 can perform echo cancellation, echo suppression, or both. Additionally, in various embodiments, echo canceller 620 can make processing adjustments for various acoustic echo delays.

In embodiments of the disclosure, a detection of double-talk by double-talk detector 622 indicates when speech is being output from the speaker 182 and input (610) through the microphone 180, which can corrupt the noise estimate, especially if the echo canceller 620 is not performing well. The echo canceller 620 cannot perform well if the speaker output speech does not resemble the echo canceller speech reference which is the speech communication 120 in FIG. 1. The spectrum shaper 640 can modify the speaker input 612 based on the spectral characteristics of the noise estimate from noise estimator 624. The double-talk detector 622 can control the audio processing blocks for audio processing control logic 630. Noise estimation rules 662 can be utilized to control when noise estimator 624 samples the noise to determine an estimate of the noise within an environment. In noise estimation rules 662, when a far end speech (e.g., downlink transmitted speech) activity is detected noise estimator 624 can be toggled to an off state and spectrum shaper 640 can be activated. In this case the noise estimate will not be affected by the spectrum shaper 640. Also, if the echo canceller 620 does not cancel all of the echo because of the double-talk the noise estimator 624 will be less affected. When a far end speech is not detected, the noise estimator 624 can be activated and the spectrum shaper 640 can be disabled so as not to corrupt the noise estimate.

From the above, it is evident that the disclosure provides enhancements for adaptive volume control in communication devices. These enhancements include increasing a degree of volume adjustment, permitting volume adjustments to be referenced from a user-established volume, to enable a user to configure dynamic volume curves used for adaptive volume control, and to control when samples of environmental ambient noise are taken. Although enhancements detailed herein are applicable to many different communication situations, these enhancements can be particularly valuable/suitable for two-way half-duplex radios.

For example, two-way half-duplex radios are frequently used by public safety and commercial users in variable, rapidly changing, extreme noise environments (e.g. airports, factories, fire scenes, stadiums, etc.) and are typically held away from the ear (e.g. forearm, shoulder, belt, console position). Thus, in heavy noise conditions much more acoustical gain (i.e. loudness) is needed to overcome the noise effects on hearing so as to insure sufficient receive side message intelligibility. To accomplish this extra loudness the hardware gain of the device output amplifier (usually controlled by the volume knob) must be increased in addition to any software scaling of the audio signal. No known conventional adaptive volume control technique exists that adjusts volume using a multi-stage approach, which includes a first stage software volume adjustment and a second stage hardware gain adjustment, as detailed herein. The total adjustment (using the software and hardware stages) occurs adaptively, without-manual interactions being required.

Additionally, half-duplex speech communication devices, such as two-way radios, are widely used by enterprises and governments. In a half-duplex system only either transmit or receive components are active at one time. That is, to save on power consumption, two-way radios often have three different operational states: a transmit state, a receive state, and an idle state. By default, audio input circuitry of the two-way radio is inactive in the receive state and idle state. Similarly, audio output circuitry can be inactive in the transmit state and the idle state. When a downlink message is received the radio needs to wake up to process the incoming signal. This wakeup period is short (tens or hundreds of milliseconds). In addition, half-duplex transmitted messages tend to be much shorter than in full duplex systems so the time available to estimate the noise and complete noise adaptation to enhance the message audio is also very short. These time limiting half-duplex radio operating conditions make noise estimation and noise-adaptive signal conditioning more problematic than for full-duplex systems. Embodiments of the invention sample a listening environment for ambient noise during the idle or receive state. Thus, the input circuitry wakes-up for sampling purposes only, and returns back to an inactive state, to again save on power expenditures. Calculations can be performed for adaptive volume control upon receiving the ambient noise samples, so that minimal delays are incurred for outputting audio, which has been adaptively adjusted. Thus, problems and latency due to short message cycles for two-way radio communications and periodic off-states for microphones are overcome.

Additionally, two-way radios with echo cancellation functions often experience problems due to feedback from speaker output when obtaining ambient noise samples. The disclosure addresses this problem by suspending ambient noise samples when the speaker is active and/or when speech is being conveyed over a speaker of the two-way radio. This ensures that no downlink audio output is included in noise estimates. Suspending ambient noise sampling can also ensure that input or output spectral shaping and/or filtering functions are not applied concurrently with the sampling, to avoid such shaping and/or filtering functions from adversely affecting estimations of ambient noise.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for adaptively controlling audio output of a communication device comprising:
   receiving a wirelessly conveyed speech communication at a communication device from another communication device, wherein said conveyed speech communication is part of a real-time communication session;
   in response to receiving the speech communication, determining a total adjustment needed for the speech communication as part of an adaptive volume control (AVC) function of the communication device;
   in response to determining the total adjustment, determining a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an adjustment to a gain of the output audio amplifier;

in response to determining the software volume adjustment and the hardware gain adjustment, applying the software volume adjustment and the hardware gain adjustment to the speech communication;

in response to the applying, outputting audio of the speech communication from an audio transducer of the communication device, wherein the total adjustment is automatically determined and applied;

sampling ambient noise from a listening environment of the communication device using a microphone of the communication device;

determining the total adjustment based on the ambient noise from the sampling; and controlling a timing of the sampling of the ambient noise based on an operating state of the communication device.

2. A method for adaptively controlling audio output of a communication device comprising:

receiving a wirelessly conveyed speech communication at a communication device from another communication device, wherein said conveyed speech communication is part of a real-time communication session;

in response to receiving the speech communication, determining a total adjustment needed for the speech communication as part of an adaptive volume control (AVC) function of the communication device;

in response to determining the total adjustment, determining a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an adjustment to a gain of the output audio amplifier;

in response to determining the software volume adjustment and the hardware gain adjustment, applying the software volume adjustment and the hardware gain adjustment to the speech communication;

in response to the applying, outputting audio of the speech communication from an audio transducer of the communication device, wherein the total adjustment is automatically determined and applied;

sampling ambient noise from a listening environment of the communication device using a microphone of the communication device;

determining the total adjustment based on the ambient noise from the sampling; and further comprising:

configuring the communication device by selecting a noise-gain curve formula from a plurality of different selectable noise-gain curve formulas stored within a memory of the communication device; and basing the software volume adjustment and the hardware gain adjustment at least in part on characteristics of the ambient noise from the sampling in accordance with the selected noise-gain curve formula.

3. A method for adaptively controlling audio output of a communication device comprising:

receiving a wirelessly conveyed speech communication at a communication device from another communication device, wherein said conveyed speech communication is part of a real-time communication session;

in response to receiving the speech communication, determining a total adjustment needed for the speech communication as part of an adaptive volume control (AVC) function of the communication device;

in response to determining the total adjustment, determining a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an adjustment to a gain of the output audio amplifier;

in response to determining the software volume adjustment and the hardware gain adjustment, applying the software volume adjustment and the hardware gain adjustment to the speech communication;

in response to the applying, outputting audio of the speech communication from an audio transducer of the communication device, wherein the total adjustment is automatically determined and applied;

sampling ambient noise from a listening environment of the communication device using a microphone of the communication device;

determining the total adjustment based on the ambient noise from the sampling; and wherein the real-time communication session is a half-duplex speech communication session, wherein timing of the sampling is controlled to ensure the sampling does not occur while transmit or receive conditions of the communications device may corrupt the sampling for the ambient noise estimate.

4. A method for adaptively controlling audio output of a communication device comprising:

receiving a wirelessly conveyed speech communication at a communication device from another communication device, wherein said conveyed speech communication is part of a real-time communication session;

in response to receiving the speech communication, determining a total adjustment needed for the speech communication as part of an adaptive volume control (AVC) function of the communication device;

in response to determining the total adjustment, determining a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an adjustment to a gain of the output audio amplifier;

in response to determining the software volume adjustment and the hardware gain adjustment, applying the software volume adjustment and the hardware gain adjustment to the speech communication;

in response to the applying, outputting audio of the speech communication from an audio transducer of the communication device, wherein the total adjustment is automatically determined and applied; and wherein the communication device is a two-way radio, wherein the real-time communication session is a half-duplex communication session, wherein the two-way radio has a transmit state, a receive state, and an idle state, wherein by default audio input circuitry of the two-way radio is inactive in the receive state and idle state to conserve power of the two-way radio, said method further comprising:

while the two-way radio is in the receive state or the idle state, intermittently turning on the audio input circuitry and sampling for ambient noise from a listening environment of the communication device and turning the audio input circuitry off immediately after the sampling to conserve power, said sampling occurring prior to the conveyed speech being received, wherein the total adjustment is based in part upon the ambient noise from the sampling.

5. A method for adaptively controlling audio output of a communication device comprising:

receiving a wirelessly conveyed speech communication at a communication device from another communication device, wherein said conveyed speech communication is part of a real-time communication session;

in response to receiving the speech communication, determining a total adjustment needed for the speech communication as part of an adaptive volume control (AVC) function of the communication device;

in response to determining the total adjustment, determining a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an adjustment to a gain of the output audio amplifier;

in response to determining the software volume adjustment and the hardware gain adjustment, applying the software volume adjustment and the hardware gain adjustment to the speech communication;

in response to the applying, outputting audio of the speech communication from an audio transducer of the communication device, wherein the total adjustment is automatically determined and applied; and wherein the communication device is a half-duplex communication device, said method further comprising:

suspending ambient noise sampling of the communication device when speech is present during transmission from the communication device; and intermittently performing the ambient noise sampling when the half-duplex speech communication device is in an idle state or a receive state;

wherein the ambient noise sampling is utilized to compute the total adjustment and wherein the software volume adjustment is set to a value less than or equal to a maximum value specified in a memory of the communication device to prevent significant problems with saturation or clipping of the speech communication.

6. A communication device comprising:
one or more processors;
one or more memories;
one or more speakers;
one or more transceivers; and
program instructions stored in at least one of the one or more memories, said program instructions being executable by the one or more processors to:

receive, via at least one of the one or more transceivers, a speech communication from another communication device, wherein said conveyed speech communication is part of a real-time communication session;

determine a total adjustment needed for the speech communication as part of an adaptive volume control (AVC) function of the communication device;

determine a software volume adjustment and a hardware gain adjustment, wherein a combination of the software volume adjustment and the hardware gain adjustment result in the total adjustment, wherein the software volume adjustment is a signal scaling adjustment of signal amplitude prior to the signal being conveyed to an output audio amplifier of the communication device, wherein the hardware gain adjustment is an hardware adjustment to the output audio amplifier;

apply the software volume adjustment and the hardware gain adjustment to the speech communication; and output audio of the speech communication from at least one of the one or more acoustic output transducers, said audio having a volume corresponding to the total adjustment, wherein the total adjustment is automatically determined and applied such that no manual user adjustment of the communication device occurs between a time the speech communication was received and a time the audio is output; and wherein said program instructions being further executable by the one or more processors to:

sample ambient noise from a listening environment of the communication device using a microphone of the communication device;

determine the total adjustment based on the ambient noise from the sampling;

receive volume input from a user manipulated control of the communication device, said volume input providing a baseline volume of audio output from the at least one speaker; and establish a minimum signal to noise ratio (SNR) threshold for audio output from the at least one speaker given the ambient noise of the listening environment; and wherein when the communication device is a half-duplex communication device, said program instructions being further executable by the one or more processors to:

suspend ambient noise sampling of the communication device when speech is present during transmission from the communication device; and intermittently perform the ambient noise sampling when the half-duplex speech communication device is in an idle state or a receive state.

7. A method for adaptively controlling volume in a half-duplex speech communication device comprising:

establishing a user specified volume for audio output from a half-duplex speech communication device having a transmit state, a receive state, and an idle state, wherein by default audio input circuitry of the half-duplex speech communication device is inactive in the receive state and idle state to conserve power of the half-duplex speech communication device;

while the half-duplex speech communication device is in the receive state or the idle state, intermittently turning on the audio input circuitry, sampling for ambient noise, and turning the audio input circuitry off immediately after the sampling to conserve power;

determining a total adjustment for adaptive audio control of the half-duplex speech communication device based on the user specified volume, the ambient noise received from the sampling, and from an established signal to noise threshold for audio output from the half-duplex speech communication device; and applying the total adjustment to received communications before audibly outputting the received communications from the half-duplex speech communication device.

8. The method of claim 7, further comprising:

determining a first stage software volume adjustment and a second stage hardware gain adjustment, wherein a combination of the first stage software volume adjustment and the second stage hardware gain adjustment result in the total adjustment, wherein the first stage software volume adjustment is a signal scaling adjustment of signal amplitude prior to a signal being conveyed to an output audio amplifier of the half-duplex speech communication device, wherein the second stage hardware gain adjustment is an hardware adjustment to the output audio amplifier, wherein the applying the total adjustment comprises applying the first stage software volume adjustment and the second stage hardware gain adjustment, wherein the total adjustment is an adjustment greater than an adjustment range available through use of the first stage software volume adjustment by itself.

\* \* \* \* \*